US010170593B2

(12) United States Patent
Bao et al.

(10) Patent No.: US 10,170,593 B2
(45) Date of Patent: Jan. 1, 2019

(54) THRESHOLD VOLTAGE MODULATION THROUGH CHANNEL LENGTH ADJUSTMENT

(71) Applicant: INTERNATIONAL BUSINESS MACHINES CORPORATION, Armonk, NY (US)

(72) Inventors: Ruqiang Bao, Niskayuna, NY (US); Dechao Guo, Niskayuna, NY (US); Derrick Liu, Albany, NY (US); Huimei Zhou, Albany, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/848,433

(22) Filed: Dec. 20, 2017

(65) Prior Publication Data

US 2018/0122813 A1  May 3, 2018

Related U.S. Application Data

(63) Continuation of application No. 15/787,768, filed on Oct. 19, 2017, which is a continuation of application
(Continued)

(51) Int. Cl.
*H01L 27/088* (2006.01)
*H01L 29/66* (2006.01)
(Continued)

(52) U.S. Cl.
CPC ............ *H01L 29/66795* (2013.01); *H01L 21/823412* (2013.01); *H01L 21/823431* (2013.01);
(Continued)

(58) Field of Classification Search
CPC ..... H01L 21/823431; H01L 21/823456; H01L 21/8258; H01L 27/0886; H01L 27/10879;
(Continued)

(56) References Cited

U.S. PATENT DOCUMENTS 5,847,419 A   12/1998 Imai et al.
6,713,779 B2   3/2004 Tezuka et al.
(Continued)

FOREIGN PATENT DOCUMENTS

KR   1020050032536 A   4/2005
KR    100697141 B1   3/2007

OTHER PUBLICATIONS

List of IBM Patents or Patent Applications Treated as Related dated Dec. 20, 2017, 2 pages.
(Continued)

*Primary Examiner* — Stephen W Smoot
(74) *Attorney, Agent, or Firm* — Tutunjian & Bitetto, P.C.; Vazken Alexanian

(57) ABSTRACT

A method of forming an arrangement of long and short fins on a substrate, including forming a plurality of finFET devices having long fins on the substrate, where the long fins have a fin length in the range of about 180 nm to about 350 nm, and forming a plurality of finFET devices having short fins on the substrate, where the short fins have a fin length in the range of about 60 nm to about 140 nm, wherein at least one of the plurality of finFET devices having a long fin is adjacent to at least one of the plurality of finFET devices having a short fin.

20 Claims, 5 Drawing Sheets

Related U.S. Application Data

No. 15/273,224, filed on Sep. 22, 2016, now Pat. No. 9,922,983.

(51) Int. Cl.
  *H01L 21/8234* (2006.01)
  *H01L 29/78* (2006.01)
  *H01L 29/423* (2006.01)
  *H01L 27/11* (2006.01)
  *H01L 27/11529* (2017.01)

(52) U.S. Cl.
  CPC .... *H01L 27/0886* (2013.01); *H01L 29/42376* (2013.01); *H01L 29/785* (2013.01); *H01L 29/7842* (2013.01); *H01L 29/7855* (2013.01); H01L 27/1116 (2013.01); H01L 27/11529 (2013.01)

(58) Field of Classification Search
  CPC ......... H01L 29/41791; H01L 29/42376; H01L 29/66795; H01L 29/785; H01L 29/7851; H01L 29/7855; H01L 29/7856
  See application file for complete search history.

(56) References Cited

U.S. PATENT DOCUMENTS

| | | |
|---|---|---|
| 7,902,014 B2 | 3/2011 | Doyle et al. |
| 7,906,802 B2 * | 3/2011 | Baumgartner .. H01L 21/823431 257/255 |
| 8,169,025 B2 * | 5/2012 | Bedell ................... H01L 21/845 257/351 |
| 8,476,716 B2 | 7/2013 | Anderson et al. |
| 8,859,348 B2 | 10/2014 | Bedell et al. |
| 8,987,069 B1 | 3/2015 | Adam et al. |
| 9,190,406 B2 | 11/2015 | Alptekin et al. |
| 9,922,983 B1 * | 3/2018 | Bao ....................... H01L 27/1104 |
| 2011/0156148 A1 * | 6/2011 | Yu ....................... H01L 27/0207 257/368 |
| 2013/0285156 A1 | 10/2013 | Cai et al. |
| 2015/0187867 A1 | 7/2015 | Basker et al. |
| 2017/0133278 A1 | 5/2017 | Bao et al. |

OTHER PUBLICATIONS

Office Action Issued in related U.S. Appl. No. 15/616,131 dated Oct. 12, 2017, pp. 1-9.

* cited by examiner

THRESHOLD VOLTAGE MODULATION THROUGH CHANNEL LENGTH ADJUSTMENT

BACKGROUND

Technical Field

The present invention generally relates to varying the threshold voltage of a fin field effect transistor (finFET) by adjusting the fin length, and more particularly to controlling the finFET device threshold voltage by configuring the fin dimensions to have a predetermined length corresponding to the intended threshold voltage.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and finFETs have been formed with the channel extending outward from the substrate, but where the current also flows horizontally from a source to a drain. The channel for the finFET can be an upright slab of thin rectangular Si, commonly referred to as the fin with a gate on the fin, as compared to a MOSFET with a single gate parallel to the plane of the substrate. Depending on the doping of the source and drain, an n-FET or a p-FET can be formed.

Examples of FETs can include a metal-oxide-semiconductor field effect transistor (MOSFET) and an insulated-gate field-effect transistor (IGFET). Two FETs also can be coupled to form a complementary metal oxide semiconductor (CMOS), where a p-channel MOSFET and n-channel MOSFET are coupled together.

With ever decreasing device dimensions, forming the individual components and electrical contacts become more difficult. An approach is therefore needed that retains the positive aspects of traditional FET structures, while overcoming the scaling issues created by forming smaller device components.

SUMMARY

In accordance with an embodiment of the present invention, a method is provided for forming an arrangement of long and short fins on a substrate. The method includes the step of forming a plurality of finFET devices having long fins on the substrate, where the long fins have a fin length in the range of about 180 nm to about 350 nm. The method further includes the step of forming a plurality of finFET devices having short fins on the substrate, where the short fins have a fin length in the range of about 60 nm to about 140 nm, wherein at least one of the plurality of finFET devices having a long fin is adjacent to at least one of the plurality of finFET devices having a short fin.

In accordance with another embodiment of the present invention, an arrangement of long fin devices and short fin devices on a substrate is provided. The arrangement of long fin devices and short fin devices on a substrate includes one or more short fins on a substrate where the one or more short fins have a fin length in the range of about 60 nm to about 140 nm. The arrangement further includes one or more long fins on a substrate, where the one or more long fins have a fin length in the range of about 180 nm to about 350 nm.

In accordance with another embodiment of the present invention, an arrangement of long fin devices and short fin devices on a substrate is provided. The arrangement of long fin devices and short fin devices on a substrate includes one or more long fins on the substrate where the one or more long fins have a threshold voltage in the range of about 260 mV to about 220 mV. The arrangement further includes one or more short fins on the substrate, where the one or more short fins have a threshold voltage in the range of about 450 mV to about 280 mV.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
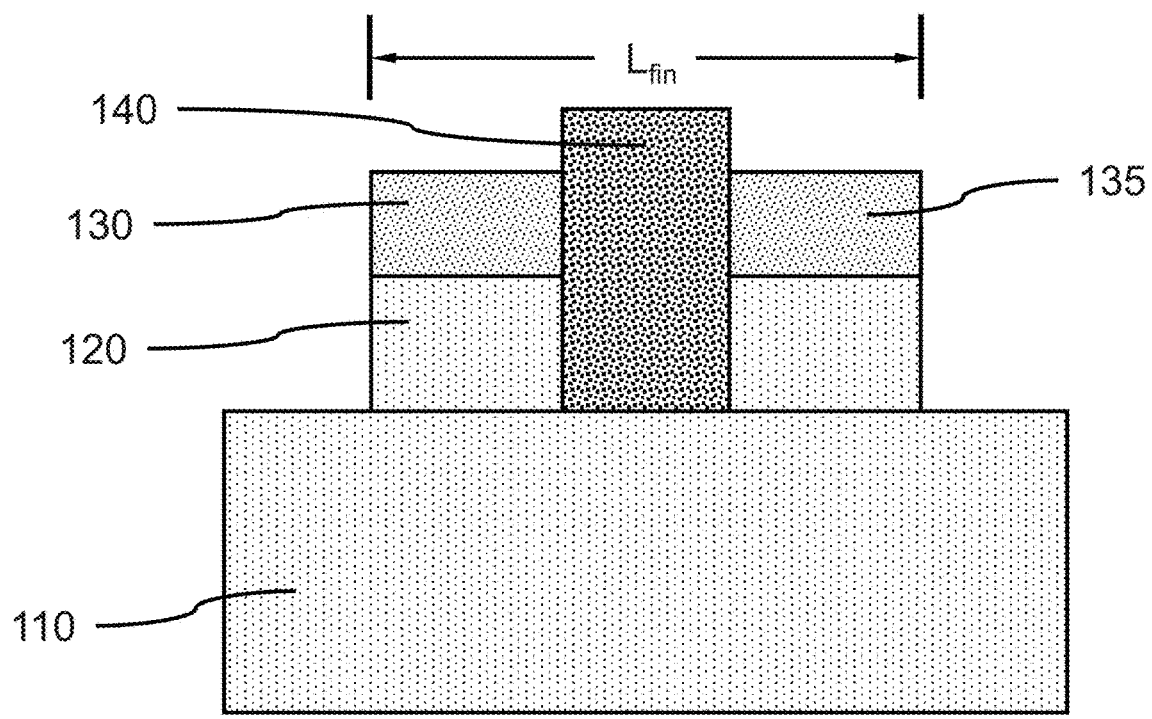
FIG. 1 is a side view of a fin field effect transistor (finFET) along a long axis of the fin, in accordance with an embodiment of the present invention.

Principles and embodiments of the present disclosure relate generally to the formation of one or more vertical fins having a predetermined length to obtain an intended threshold voltage for the finished fin field effect transistor (finFET) device. The value for the threshold voltage can be correlated to the length of the fin, as well as an induced strain that can affect charge mobility and/or band gap. A change in fin length can directly affect the electrical characteristics of the finished finFET device, where a longer fin length can correspond to a lower threshold voltage, $V_t$, and a comparably shorter fin length can correspond to a higher $V_t$.

Principles and embodiments of the present disclosure also relate generally to determining a threshold voltage resulting from a finFET having a particular length and material composition, and laying out the fin fabrication to have the predetermined length to achieve the intended voltage. Providing a fin with a comparably longer length for fabrication of a device can provide a finFET with a lower $V_t$, whereas providing a fin with a comparably shorter length for fabrication of a device can provide a finFET with a higher $V_t$.

Principles and embodiments of the present disclosure also relate generally to fabricating a combination of long fin device(s) and short fin device(s) on the same substrate, where the long fin devices can provide certain types of devices having improved performance from a lower $V_t$ on a region of a substrate, and the short fin devices can provide different types of devices having improved performance from a higher $V_t$ on a region of the substrate adjacent to the long fin devices. One or more long fins can be adjacent to each other on a first region of the substrate, and one or more short fins can be adjacent to each other on a second region of the substrate, where the first region can be adjacent to the second region on the same substrate. Alternating long fin devices and short fin devices can also be fabricated on the same region of the substrate to form denser device configurations.

Principles and embodiments of the present disclosure also relate generally to high mobility channel silicon-germanium (SiGe) finFETs having induced strain due to lattice mismatch with the substrate material being configured with predetermined fin lengths to vary the finFET device's threshold voltage without changing germanium concentration in the fin material and/or doping concentrations. The present principles and embodiments can also be directed to utilizing different channel and/or substrate materials to control the amount of induced strain and fin/substrate compatibilities to control the finFET device's threshold voltage.

Principles and embodiments of the present disclosure also relate generally to obtaining finFET devices with different threshold voltages, $V_t$, at the same time without changing material compositions or doping concentrations during a fabrication process, by forming fins of different predetermined lengths to achieve different intended $V_t$'s.

Exemplary applications/uses to which the present principles can be applied include, but are not limited to: formation of complementary metal oxide silicon (CMOS) field effect transistors (FETs) formed by coupled finFETs, digital gate devices (e.g., NAND, NOR, XOR, etc.), and memory devices (e.g. static random access memory (SRAM), dynamic access memory (DRAM), etc.).

It is to be understood that the present invention will be described in terms of a given illustrative architecture; however, other architectures, structures, substrate materials and process features and steps can be varied within the scope of the present invention.

It should be noted that certain features may not be shown in all figures for the sake of clarity. This is not intended to be interpreted as a limitation of any particular embodiment, or illustration, or scope of the claims.

Reference to source/drain layers, regions, etc., is intended to indicate that the particular device feature can be implemented as a source or a drain except as expressly indicated otherwise. In addition, the role of source and drain for an active device may in some instances be reversed, so a previously indicated drain can instead be a source and vice versa. Reference to a source/drain is, therefore, intended to encompass the broadest reasonable scope of the term.

Referring now to the drawings in which like numerals represent the same or similar elements and initially to FIG. 1, a side view of a fin field effect transistor (finFET) along a long axis of the fin is shown, in accordance with an embodiment of the present invention.

In one or more embodiments, a substrate 110 can be a semiconductor or an insulator with an active surface semiconductor layer. The substrate can be crystalline, semi-crystalline, microcrystalline, or amorphous. The substrate can be essentially (i.e., except for contaminants) a single element (e.g., silicon), primarily (i.e., with doping) of a single element, for example, silicon (Si) or germanium (Ge), or the substrate can include a compound, for example, $Al_2O_3$, $SiO_2$, GaAs, SiC, or SiGe. The substrate can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate can also have other layers forming the substrate, including high-k oxides and/or nitrides. In one or more embodiments, the substrate 110 can be a silicon wafer. In various embodiments, the substrate can be a single crystal silicon (Si), silicon germanium (SiGe), or III-V semiconductor (e.g., GaAs) wafer, or have a single crystal silicon (Si), silicon germanium (SiGe), or III-V semiconductor (e.g., GaAs) surface/active layer.

In one or more embodiments, a fin 120 can be formed on at least a portion of the surface of a substrate 110, where the fin can be made of a different material than the material at the surface of the substrate.

In various embodiments, the fin 120 can be single crystal silicon (Si), single crystal silicon-germanium (SiGe) or a single crystal III-V semiconductor material (e.g., GaAs, InAs, etc.), and the material at the surface of the substrate 110 can be single crystal silicon (Si), single crystal silicon-germanium (SiGe), or single crystal III-V semiconductor (e.g., GaAs, InAs, etc.), where the fin material can be different from the substrate. The difference in materials can provide a difference in crystal lattice constants that can induce a lattice strain in the fin 120.

In one or more embodiments, the substrate can be a silicon-germanium ($Si_xGe_{1-x}$) active material layer on a single crystal silicon (Si), single crystal silicon-carbide (SiC), single crystal silicon germanium ($Si_xGe_{1-x}$), or single crystal silicon phosphide (SiP) carrier material, as well as other semiconductor materials that can provide a crystal lattice mismatch between the active material layer and the carrier material. The crystal lattice mismatch can provide a stress/strain to the fin 120.

In one or more embodiments, the lattice constant of the SiGe fin can be in the range of 5.431 A to 5.47 A, which could results in a $V_t$ shift as high as about 100 mV, where different lattice mismatches can result in different shifts in $V_t$.

In one or more embodiments, the fin can have a length, $L_{fin}$, in the range of about 50 nm to about 1250 nm, or in the range of about 128 nm to about 400 nm, or in the range of about 128 nm to about 250 nm, or in the range of about 250 nm to about 375 nm, where the length of the fin 120 can correspond to a specific threshold voltage obtained for a finFET device. In various embodiments, the length can be about 2×CPP (i.e., Contacted Poly Pitch (CPP)), where CPP is the distance between one gate and the nearest adjacent gate) to about 6×CPP, where 6×CPP≤400 nm, where the minimum length can be with a tucked structure, where the end of the fin does not extend into the body of a dummy gate.

In a non-limiting exemplary embodiment, a SiGe finFET device can have a $V_t$ of 230 mV with a fin length, $L_{fin}$, of 400 nm. In another non-limiting exemplary embodiment, a SiGe finFET device can have a $V_t$ of 300 mV with a fin length, $L_{fin}$, of about 100 nm, where the $V_t$ increases with decreasing length (all other parameters being the same).

In one or more embodiments, the fin can have a height in the range of about 10 nm to about 100 nm, or in the range of about 20 nm to about 70 nm or in the range of about 25 nm to about 60 nm, where increasing the fin height can result in a lower $V_t$, holding fin length, $L_{fin}$, and material of the substrate and fin the same.

In one or more embodiments, the germanium concentration of a silicon-germanium fin 120 or substrate 110 may be changed to adjust the resulting threshold voltage, $V_t$, where a change in germanium concentration that produces a larger difference in lattice constant results in an increased $V_t$, and a change in germanium concentration that produces a smaller difference in lattice constant results in a decreased $V_t$.

In various embodiments, a change in germanium concentration of the fin 120 or substrate 110, and/or a change in fin height may alter the relationship between fin length, $L_{fin}$, and threshold voltage, $V_t$, where the germanium concentration and/or fin height can make $V_t$ more sensitive or less sensitive to changes in $L_{fin}$.

In one or more embodiments, a gate structure 140 can be formed on at least a portion of the fin 120, where the gate structure 140 can wrap around at least a portion of three sides of the fin 120. In various embodiments, the gate structure 140 can include a gate dielectric layer, a gate metal fill, and optionally a work function layer between the gate dielectric layer and the gate metal fill.

The gate structure 140 can be fabricated on the fin 120 by methods and processes known in the art, where layers can be deposited using known chemistries and parameters, and patterned and etched, using known processes and masking techniques to form a finFET device. In various embodiments, a plurality of vertical fins can be formed by a sidewall image transfer (SIT) process, self-aligned double patterning (SADP), or self-aligned quadruple patterning (SAQP) to provide a tight pitch between vertical fins.

In one or more embodiments, the gate structure can include a dielectric layer on a fin 120, where the dielectric layer can be an insulating dielectric layer, for example, a silicon dioxide ($SiO_2$) or a high-K dielectric.

In various embodiments, the gate dielectric layer can be a high-K dielectric material that can include, but is not limited to, transition metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($PbSc_xTa_{1-x}O_3$), and lead zinc niobate (e.g., $PbZn_{1/3}Nb_{2/3}O_3$). The high-k material can further include dopants such as lanthanum and/or aluminum. The stoichiometry of the high-K dielectric materials can vary.

In various embodiments, the gate fill layer can be a conductive metal, where the metal can be tungsten (W), titanium (Ti), molybdenum (Mo), cobalt (Co), or a conductive carbon material (e.g., carbon nanotube, graphene, etc.), or any suitable combinations thereof.

In various embodiments, a work function layer can be a conductive metal, including but not limited to, aluminum (Al), titanium (Ti), tungsten (W), a conductive metal alloy/compound, including but not limited to, titanium-aluminum (TiAl), cobalt aluminum (COAl), a conductive nitride, including but not limited to, titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); and/or a conductive carbide, including but not limited to, titanium carbide (TiC), titanium aluminum carbide (TiAlC), tantalum carbide (TaC), tantalum aluminum carbide (TaAlC), hafnium carbide (HfC); or combinations thereof. The work function layer can include multiple layers of work function materials, for example, a work function layer can be a TiN/TiAl stack.

In one or more embodiments, a source/drain 130, 135 can be formed on opposite sides of the gate structure 140, where the source/drains 130, 135 can be epitaxially grown on exposed portions of the fin 120 by processes known in the art. A first source/drain 130 can be located on a first side of the gate structure 140, and a second source/drain 135 can be opposite the first source/drain on the opposite side of the gate structure, where current can flow from the first source/drain 130 passed the gate structure 140 to the second source/drain 135 in a direction essentially parallel to the plane of the substrate surface. Electrical connections can be made to the source/drains 130, 135 and gate structure 140, as would be known in the art.

Figure 2:
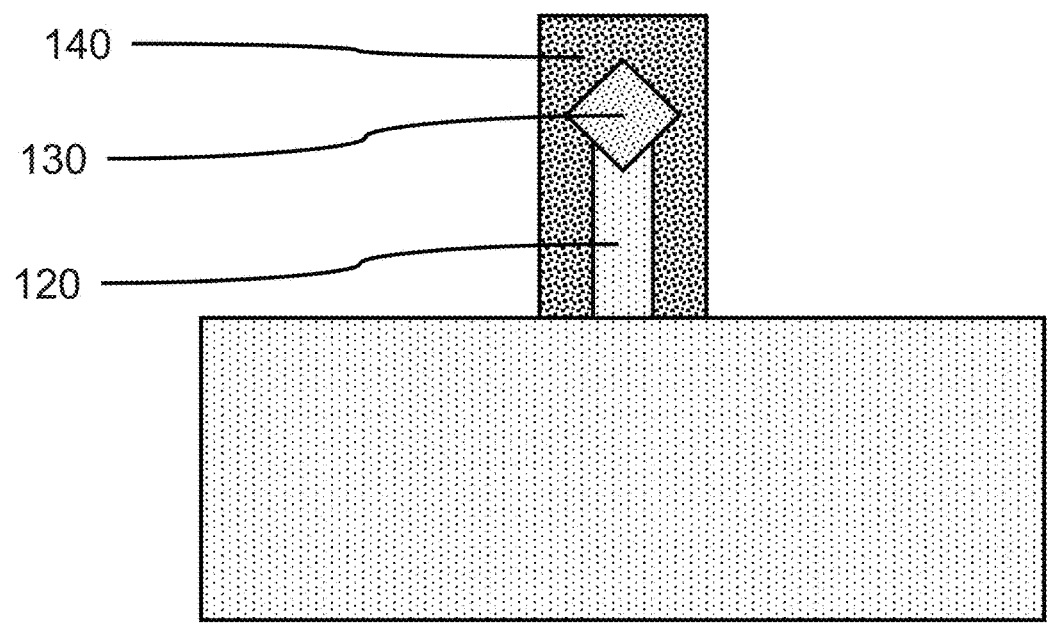
FIG. 2 is an end-on view of a finFET device, in accordance with an embodiment of the present invention.

FIG. 2 is an end-on view of a finFET device, in accordance with an embodiment of the present invention.

In one or more embodiments, the gate structure 140 can be on at least a portion of three sides of the fin 120. The source/drains 130, 135 can be formed on a top surface of the fin 120.

Figure 3:
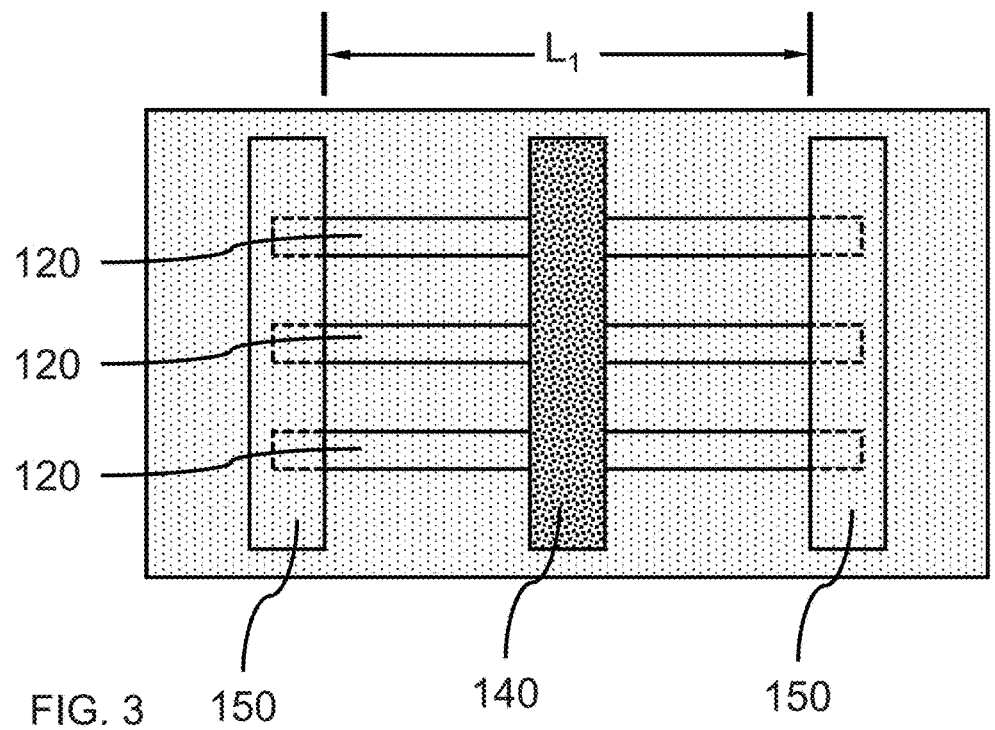
FIG. 3 is a top view of a finFET device having an active gate on a central portion of a plurality of fins and dummy gates on each end of the plurality of fins with a non-tucked structure, in accordance with an embodiment of the present invention.

FIG. 3 is a top view of a finFET device having an active gate on a central portion of a plurality of fins and dummy gates on each end of the plurality of fins with a non-tucked structure, in accordance with an embodiment of the present invention.

In one or more embodiments, each of the one or more fin(s) 120 forming a finFET device can have a long fin length, $L_1$, in the range of about 180 nm to about 350 nm that can provide a threshold voltage, $V_{t1}$, in the range of about 260 mV to about 220 mV, where $L_2 > L_1$, and $V_{t2} < V_{t1}$. A long fin length can be the lesser of 6×CPP or 400 nm, but larger than 3×CPP (Contacted Poly Pitch).

Figure 4:
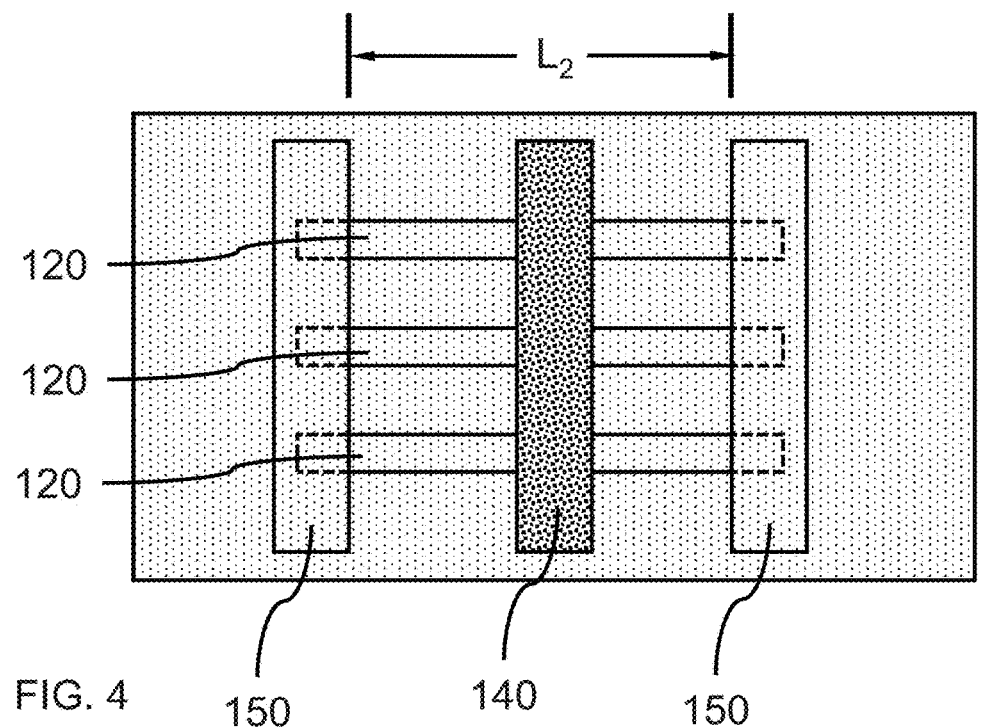
FIG. 4 is a top view of a finFET device having an active gate on a central portion of a plurality of fins and dummy gates on each end of the plurality of fins with a non-tucked structure, in accordance with an embodiment of the present invention.

FIG. 4 is a top view of a finFET device having an active gate on a central portion of a plurality of fins and dummy gates on each end of the plurality of fins with a non-tucked structure, in accordance with an embodiment of the present invention.

In one or more embodiments, each of the one or more fin(s) 120 forming a finFET device can have a short fin length, $L_2$, in the range of about 60 nm to about 140 nm that can provide a threshold voltage, $V_{t2}$, in the range of about 450 mV to about 300 mV, where $V_{t2}$ decreases with the increasing fin length. A minimum fin length $L_{fin1}$ can be 2×CPP with a tucked structure. The fin length can be about half the gate dimension for a non-tucked structure. A short fin can have a minimum length of 2×CPP, where the short fin length can be in the range of about 2×CPP to about 3×CPP. The $V_t$ value can be larger if the channel Ge percentage is increased, and smaller if the Ge concentration is decreased in the fin 120.

In one or more embodiments, a long fin can have a maximum fin length, where the fin has a fully stressed fin length, $L_{fin}$, beyond which $V_t$ does not appreciably change with increasing length. A maximum fin length can be equal to or less than 400 nm.

In various embodiments, a plurality of fins having a shorter fin length can provide a higher pattern density with a higher $V_t$. A higher $V_t$ can provide lower threshold current leakage with lower resulting power consumption. A longer fin length can provide a lower $V_t$ resulting in faster device speeds.

Figure 5:
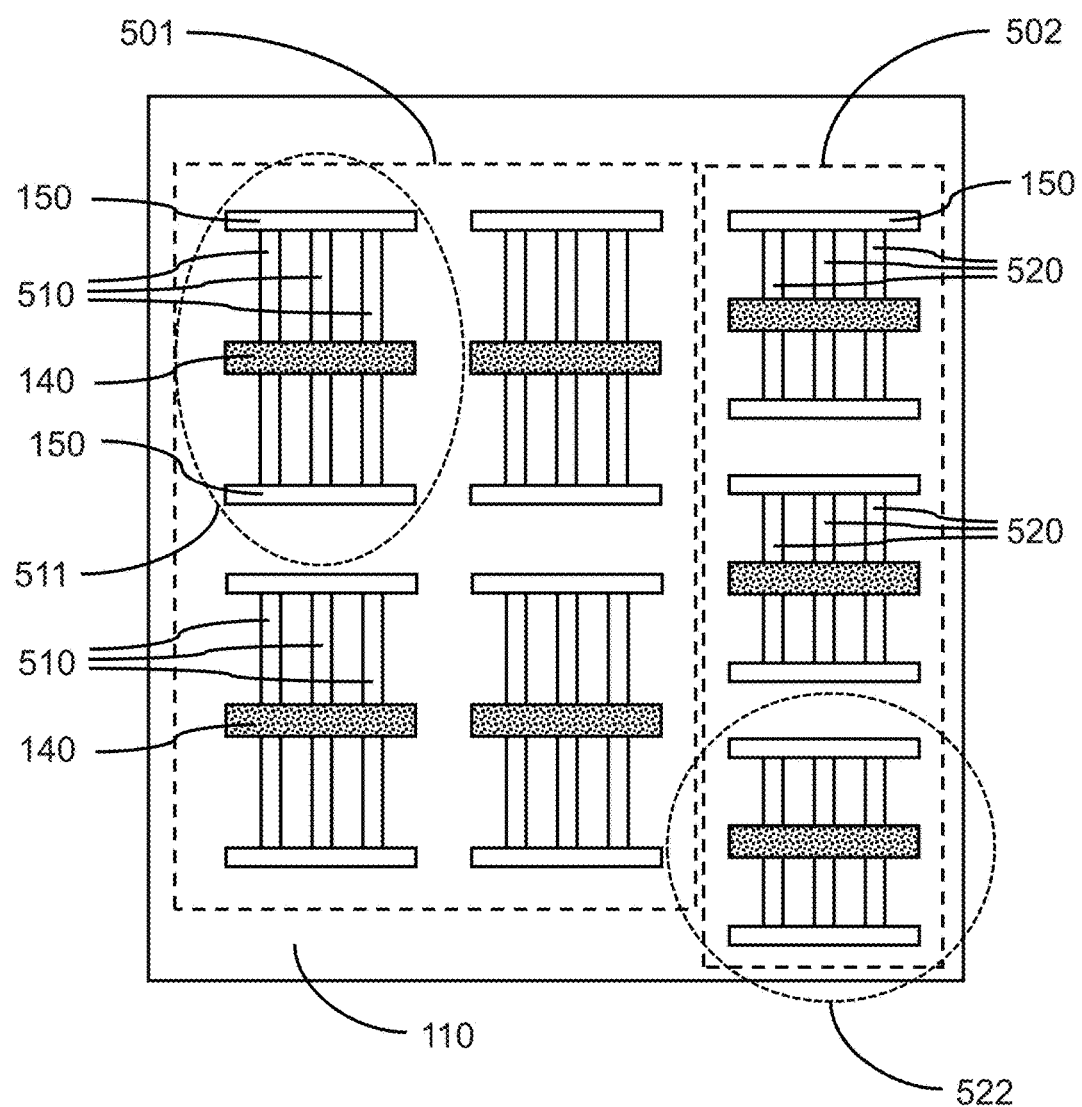
FIG. 5 is a top view of a plurality of long fin devices on a first region of a substrate and a plurality of short fin devices on a second region of a substrate, in accordance with an embodiment of the present invention.

FIG. 5 is a top view of a plurality of long fin devices on a first region of a substrate and a plurality of short fin devices on a second region of a substrate, in accordance with an embodiment of the present invention.

In one or more embodiments, finFET devices 511 with longer fin lengths can be arranged on a substrate 110 adjacent to finFET devices 522 with shorter fin lengths to provide a combination of finFET devices on the substrate with higher $V_t$ and lower $V_t$. One or more short fins 520 can have a threshold voltage at least 100 mV greater than the threshold voltage of the one or more long fins 510.

In one or more embodiments, one or more long fins 510 can be fabricated on a first region 501 of a substrate 110, and one or more short fins 520 can be fabricated on a second region 502 of a substrate 110. The first region 501 can be adjacent to the second region 502 on the substrate, such that a long fin 510 can be adjacent to a short fin 520. In other embodiments, long fins and short fin can be interspersed on the same region of the substrate, where the long fins and short fins may alternate. The long fins can have a greater fin length than the short fins in the same or neighboring regions on the substrate.

A plurality of fins can be formed on the same regions of a substrate, where the plurality of fins are adjacent to each other. The fins can be same length when initially formed on the substrate, or different sized fins can be formed on the substrate utilizing processes known in the art. Portions of some of the fins can be removed to adjust the fin lengths to provide long fins 510 and short fins 520 on the substrate. The lengths of different fins can be modified to provide fins with two or more different fin lengths.

In various embodiments, a dummy gate 150 can be fabricated on one or both ends of a long fin 510 and/or a short fin 520, where the dummy gate can protect the ends of the fins and/or provide for a more uniform fabrication of the source/drains 130, 135 on either side of the gate structure 140. A dummy gate 150 can cover at least a portion of a long or short fin 510, 520 to form a non-tucked structure, or the dummy gate 150 can be against the endwall of the fin 510, 520 to form a tucked structure. The fins in FIG. 5 illustrate a tucked structure, where the fins do not extend under the dummy gates 150, but instead are in contact with the sidewall of the dummy gate 150.

In one or more embodiments, one or more of the long fins 510 can be included in a long fin device 511 on a first region 501 of the substrate. In various embodiments, a multi-fin device can include a plurality of long fins 510 electrically coupled together and sharing the same gate structure, where the multi-fin device can be a finFET device. A plurality of long fin devices 511 on the same substrate region can be coupled together to form a logic device. In a non-limiting exemplary embodiment, multiple long fin devices can provide finFETs for a logic gate (e.g., two long fin devices can form a NAND gate, four long fin devices can form a NOT gate, etc.).

In one or more embodiments, one or more of the short fins 520 can be included in a short fin device 522 on a second region 502 of the substrate. In various embodiments, a multi-fin device can include a plurality of short fins 520 electrically coupled together and sharing the same gate structure, where the multi-fin device can be a finFET device. One or more short fin devices 522 on the same substrate region can be coupled together to form a memory device. In a non-limiting exemplary embodiment, a single short fin device can be a finFET for a DRAM storage cell, where the higher threshold voltage of the short fin device can provide lower leakage current for the memory device compared to lower $V_t$ DRAM memory cells. In another non-limiting exemplary embodiment, a plurality of short fin devices can be finFETs for an SRAM memory cell (e.g., two short fin devices for a flip-flop, six devices for a CMOS SRAM memory cell, etc.).

In one or more embodiments, a plurality of memory devices can be formed adjacent to a plurality of logic devices using the same fabrication steps by forming a plurality of long fin devices 511 in a region 501 on the substrate adjacent to a plurality of short fin devices 522 in a region 502 adjacent to region 501. The fins 510, 520 can be formed at the same time, and the lengths adjusted during an etching step to provide long fins 510 and short fins 520 together on the substrate, such that a plurality of long fins and a plurality of short fins are formed on the substrate at the same time.

In one or more embodiments, a plurality of finFET devices having long fins forming one or more digital logic devices can be on a first region of the substrate, and a plurality of finFET devices having short fins forming one or more memory devices can be on a second region of the substrate, where the first region is adjacent to the second region on the substrate. A plurality of long fins 510 formed on the same region of the substrate can be made of different materials and/or have different dopants to form one or more n-type finFETs (i.e., nFETs) and one or more p-type finFETs (i.e., pFETs). The nFETs and pFETs having long fins 510 can be coupled to form one or more complementary semiconductor-on-metal (CMOS) devices on the same region of the substrate 110.

Figure 6:
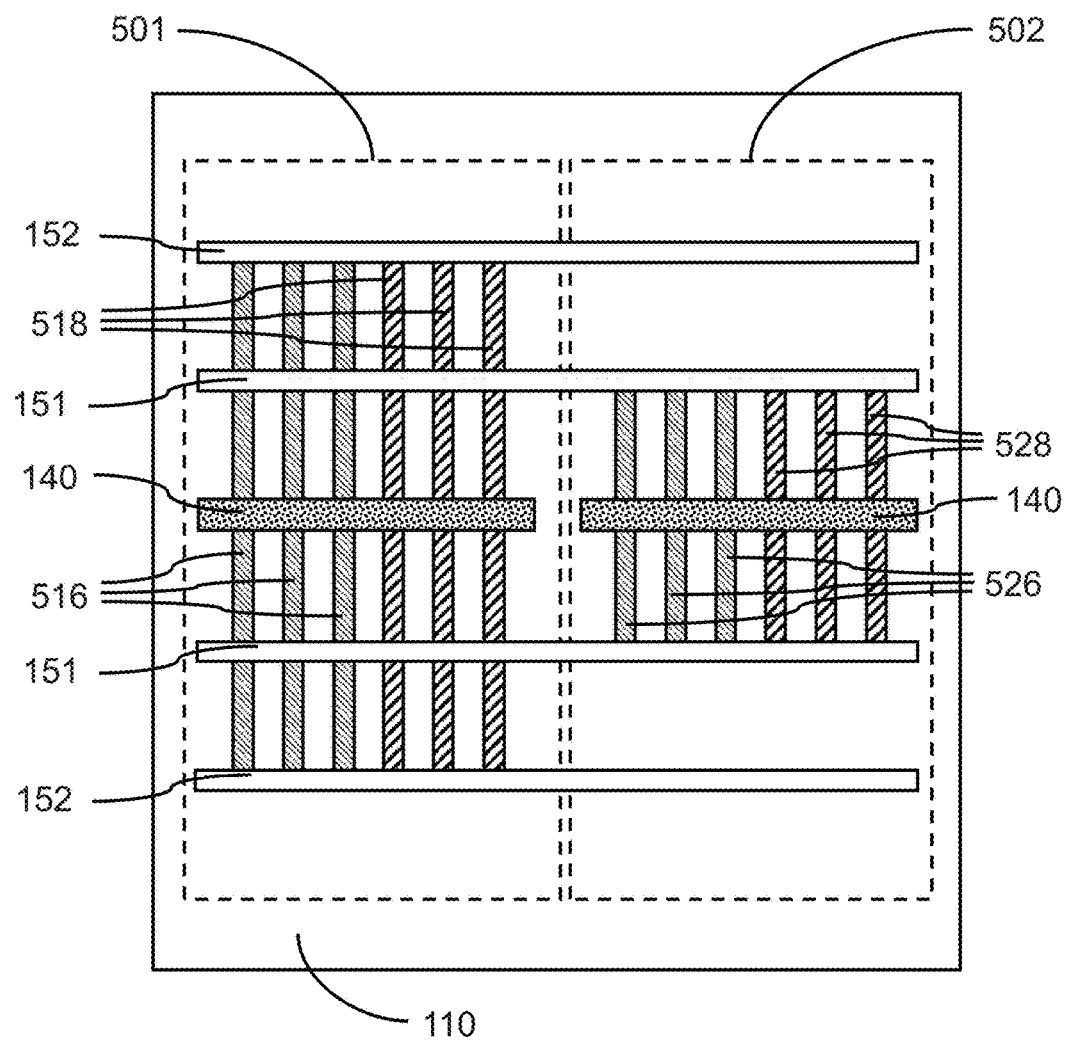
FIG. 6 is a top view of a plurality of n-type and p-type long fins on a first region of a substrate and a plurality of n-type and p-type short fins on a second region of a substrate, in accordance with an embodiment of the present invention.

FIG. 6 is a top view of a plurality of n-type and p-type long fins on a first region of a substrate and a plurality of n-type and p-type short fins on a second region of a substrate, in accordance with an embodiment of the present invention.

In one or more embodiments, a plurality of n-type long fins 516 and a plurality of p-type long fins 518 can be formed on a first region 501 of the substrate, where the n-type long fins 516 can form an nFET and the p-type long fins 518 can form a pFET.

In one or more embodiments, a plurality of n-type short fins 526 and a plurality of p-type short fins 528 can be formed on a second region 502 of the substrate, where the n-type short fins 526 can form an nFET and the p-type short fins 528 can form a pFET.

In one or more embodiments, the nFET can be formed by one or more short fin(s), whereas the pFET can be formed by one or more long fin(s).

In one or more embodiments, a plurality of dummy gates 151, 152 can be formed on either side of an active gate 140, where the dummy gates 150 can be separated by a predetermined distance, such that fins formed between a first two dummy gates 151 closest to the active gate 140 would be short fins, and fins formed between a second two dummy gates 152 further away from the active gate would be long fins. In various embodiments, one or more short fins 526, 528 can be formed by removing the fin material between the first dummy gates 151 and the second dummy gates 152, whereas long fins can be formed by leaving the fin material between the first dummy gates 151 and the second dummy gates 152. The fin material between the first dummy gates 151 and the second dummy gates 152 can be removed by a masking and etching process.

Figure 7:
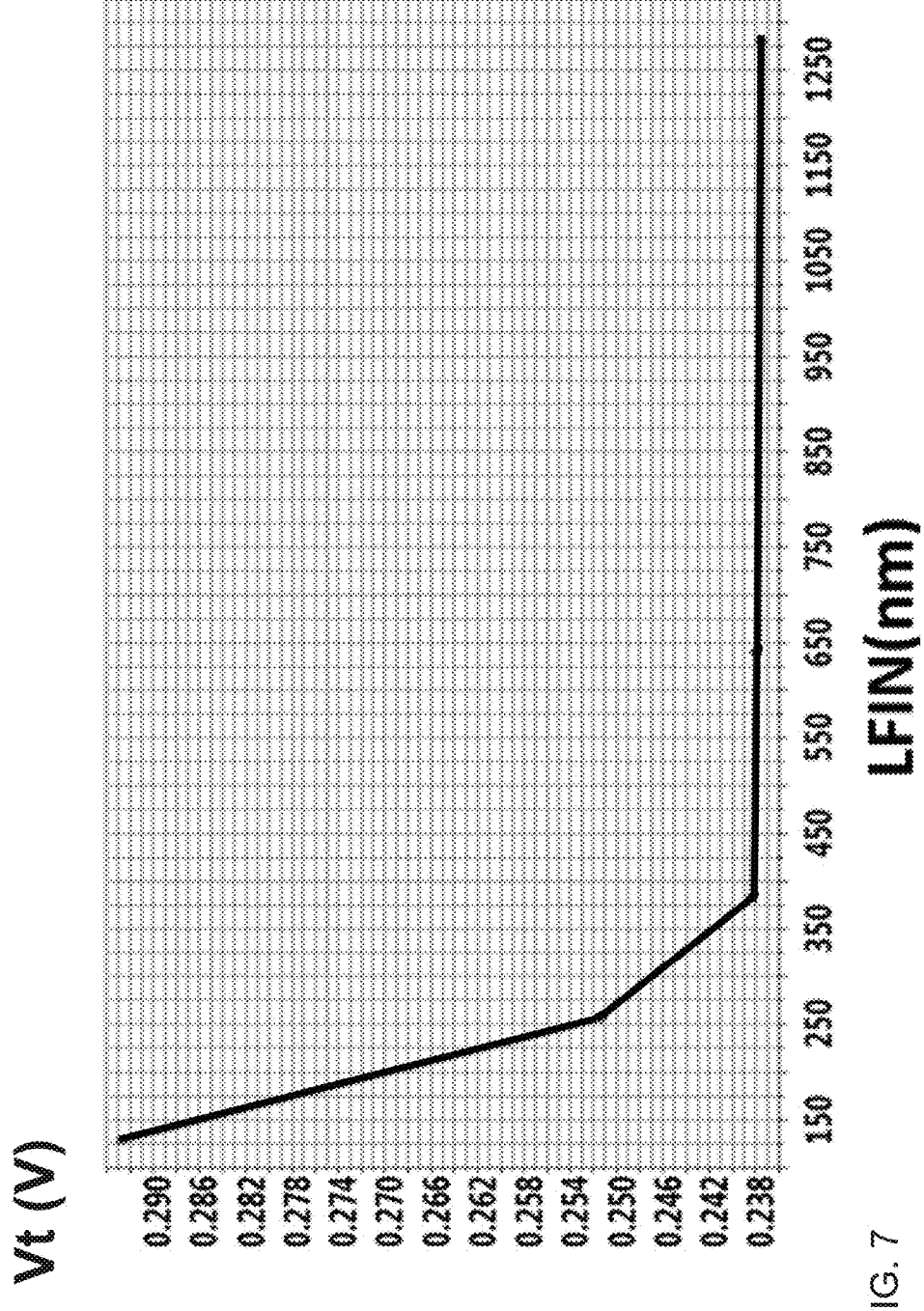
FIG. 7 is a graph of threshold voltage, $V_t$, in volts (V) on the Y-axis, and fin length, $L_{fin}$, in nanometers (nm) on the X-axis, in accordance with an embodiment of the present invention.

FIG. 7 is a graph of threshold voltage, $V_t$, in volts (V) on the Y-axis, and fin length in nanometers (nm) on the X-axis, in accordance with an embodiment of the present invention.

The $V_t$ data obtained for the graph in FIG. 7 was obtained using an Agilent® Semiconductor Parameter Analyzer for finFET devices having varying fin lengths. In taking the measurements, $I_d$ (i.e., drain current) is set at a small voltage level, and the gate is swept through a range of voltages, while $V_t$ is measured at a constant drain current.

It can be seen that a large change in threshold voltage occurs from about 100 nm to about 250 nm for $L_{fin}$. A smaller change occurs in threshold voltage occurs from about 250 nm to about 375 nm for $L_{fin}$. The threshold voltage remains substantially constant for fins having fin lengths, $L_{fin}$, above about 375 nm to 1 μm and greater.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It should be understood that use of descriptions such as top, bottom, left, right, vertical, horizontal, or the like, are intended to be in reference to the orientation(s) illustrated in the figures, and are intended to be descriptive and to distinguish aspects of depicted features without being limiting. Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Reference to first, second, third, etc., feature is intended to distinguish features without necessarily implying a particular order unless otherwise so stated or indicated. Thus, a first element discussed herein could be termed a second element without departing from the scope of the present concept.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a device and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming an arrangement of long fin and short fin devices on a substrate, comprising:
    forming a plurality of long fins on the substrate;
    forming a plurality of short fins on the substrate, wherein the short fins are shorter than the long fins;
    forming a first active gate across the plurality of long fins;
    forming a second active gate across the plurality of short fins, wherein at least one of the plurality of long fins is adjacent to at least one of the plurality of short fins; and
    forming at least two dummy gates across the plurality of long fins.

2. The method of claim 1, wherein the at least two dummy gates are at least four dummy gates with at least two dummy gates on the plurality of long fins on a first side of the first active gate and at least two other of the at least four dummy gates on the opposite side of the first active gate, and wherein a first of the at least two dummy gates on each side is between a second of the at least two dummy gates and the first active gate, and the second of the at least two dummy gates on opposite sides of the first active gate are on opposite ends of the plurality of long fins.

3. The method of claim 2, wherein the first of the at least two dummy gates on each side of the first active gate are on the opposite ends of the plurality of short fins.

4. The method of claim 3, wherein the plurality of long fins are on a first region of the substrate, and the plurality of short fins are on a second region of the substrate adjacent to the first region.

5. The method of claim 4, wherein the first of the at least two dummy gates on each side of the first active gate extend from the first region to the second region.

6. The method of claim 5, wherein a difference in lattice constants between the substrate and the short fins imparts a strain to the short fins.

7. The method of claim 1, wherein at least one of the plurality of long fins is a p-type long fin, and at least one other of the plurality of long fins is an n-type long fin.

8. The method of claim 7, wherein the long fins form one or more digital logic devices on a first region of the substrate, and the short fins form one or more memory devices on a second region of the substrate.

9. The method of claim 1, wherein the substrate is single crystal silicon and the short fins are made of single crystal silicon-germanium.

10. A method of forming an arrangement of long fin and short fin devices on a substrate, comprising:
    forming a plurality of long fins on the substrate, wherein the plurality of long fins have a fin length in the range of about 180 nm to about 350 nm;
    forming a plurality of short fins on the substrate, wherein the plurality of short fins have a fin length in the range of about 60 nm to about 140 nm;
    forming a first active gate across the plurality of long fins;
    forming a second active gate across the plurality of short fins, wherein at least one of the plurality of long fins is adjacent to at least one of the plurality of short fins; and
    forming four dummy gates, wherein two dummy gates are on the plurality of long fins on a first side of the first active gate and two dummy gates are on the opposite side of the first active gate, and wherein a first of the two dummy gates on each side is between the second of the two dummy gates and the first active gate, and the second of the two dummy gates are on opposite ends of the plurality of long fins.

11. The method of claim 10, wherein the plurality of long fins are adjacent to each other on a first region of the substrate, and the plurality of short fins are adjacent to each other on a second region of the substrate.

12. The method of claim 11, wherein the first of the two dummy gates on each side of the first active gate extend from the first region to the second region, and the first of the two dummy gates on each side of the first active gate are on the opposite ends of the plurality of short fins.

13. The method of claim 12, wherein the plurality of long fins form one or more long fin finFET devices, and the plurality of short fins form one or more short fin finFET devices.

14. The method of claim 13, wherein the one or more long fin finFET devices form at least one digital logic device, and the one or more short fin finFET devices form at least one memory device.

15. The method of claim 14, wherein the at least one digital logic device is a NAND gate device, and the at least one memory device is a static random access memory (SRAM) device.

16. A method of forming an arrangement of long fin and short fin devices on a substrate, comprising:
    forming a plurality of long fins on the substrate, wherein the plurality of long fins have a fin length in the range of about 180 nm to about 350 nm;
    forming a plurality of short fins on the substrate, wherein the plurality of short fins have a fin length in the range of about 60 nm to about 140 nm;
    forming a first active gate across the plurality of long fins to form a long fin device;
    forming a second active gate across the plurality of short fins to form a short fin device, wherein at least one of the plurality of long fins is adjacent to at least one of the plurality of short fins; and
    forming four dummy gates, wherein two dummy gates are on the plurality of long fins on a first side of the first active gate and two dummy gates are on the opposite side of the first active gate, and wherein a first of the two dummy gates on each side is between the second of the two dummy gates and the first active gate, and the second of the two dummy gates are on opposite ends of the plurality of long fins, and wherein the one or more long fins have a threshold voltage in the range of about 260 mV to about 220 mV.

17. The method of claim 16, wherein the one or more long fins and one or more short fins are made of silicon-germanium.

18. The method of claim 16, wherein the short fin device has a threshold voltage at least 100 mV greater than the threshold voltage of the long fin device.

19. The method of claim 16, wherein the one or more short fins have a fin length of about two times the Contacted Poly Pitch (CPP), and the one or more long fins have fin length of about six times the CPP.

20. The method of claim 16, wherein the substrate is a silicon-germaium ($Si_xGe_{1-x}$) active material layer on a single crystal silicon (Si), single crystal silicon-carbibe (SiC), single crystal silicon germanium ($Si_xGe_{1-x}$), or single crystal silicon phosphide (SiP) carrier material.

* * * * *